(12) United States Patent
Kim

(10) Patent No.: US 10,720,121 B2
(45) Date of Patent: Jul. 21, 2020

(54) HALF-POWER BUFFER AMPLIFIER, DATA DRIVER AND DISPLAY APPARATUS INCLUDING THE SAME

(71) Applicant: DB HiTek Co., Ltd, Seoul (KR)

(72) Inventor: Ik Hyun Kim, Seongnam-si (KR)

(73) Assignee: DB HiTek Co., Ltd., Seoul (KR)

( * ) Notice: Subject to any disclaimer, the term of this patent is extended or adjusted under 35 U.S.C. 154(b) by 0 days.

(21) Appl. No.: 16/227,618

(22) Filed: Dec. 20, 2018

(65) Prior Publication Data

US 2020/0043435 A1 Feb. 6, 2020

(30) Foreign Application Priority Data

Aug. 1, 2018 (KR) .................. 10-2018-0089809

(51) Int. Cl.
*G09G 3/36* (2006.01)
*H03F 3/45* (2006.01)

(52) U.S. Cl.
CPC ......... *G09G 3/3688* (2013.01); *G09G 3/3614* (2013.01); *H03F 3/45179* (2013.01); *G09G 2310/0289* (2013.01); *G09G 2310/0291* (2013.01); *G09G 2330/021* (2013.01); *H03F 2200/421* (2013.01); *H03F 2203/45344* (2013.01); *H03F 2203/45354* (2013.01)

(58) Field of Classification Search
CPC ............... G09G 3/3688; G09G 3/3614; G09G 2310/0289; G09G 2310/0291; G09G 2330/021; H03F 3/45179; H03F 2203/45354; H03F 2203/45344; H03F 2200/421
See application file for complete search history.

(56) References Cited

U.S. PATENT DOCUMENTS

| | | | | |
|---|---|---|---|---|
| 6,344,776 B1* | 2/2002 | Enriquez | ............... | H03F 3/3432 323/315 |
| 2009/0039959 A1* | 2/2009 | An | ........................ | H03F 3/3022 330/255 |
| 2010/0182297 A1* | 7/2010 | Lan | ...................... | G09G 3/3614 345/211 |
| 2016/0173065 A1* | 6/2016 | Kim | ...................... | H03K 3/012 327/109 |

* cited by examiner

*Primary Examiner* — Alexander Eisen
*Assistant Examiner* — Kebede T Teshome
(74) *Attorney, Agent, or Firm* — Andrew D. Fortney; Central California IP Group, P.C.

(57) ABSTRACT

A half-power buffer amplifier includes an amplification unit including first and second nodes, the amplification unit configured to differentially amplify a differential input signal and to output a differentially amplified output signal, a first output unit including a first buffer unit between a first power source having a first voltage and a second power source having a second voltage, a second buffer unit between the first and second power sources, and a first switch unit between the first and second buffer units, and a second output unit including a third buffer unit between the second power source and a third power source having a third voltage, a fourth buffer unit between the second and third power sources, and a second switch unit between the third and fourth buffer units. Each of the first to third buffer units receives the differentially amplified output signal. The first switch unit is turned on or off based on or in response to a pre-driving control signal.

13 Claims, 11 Drawing Sheets

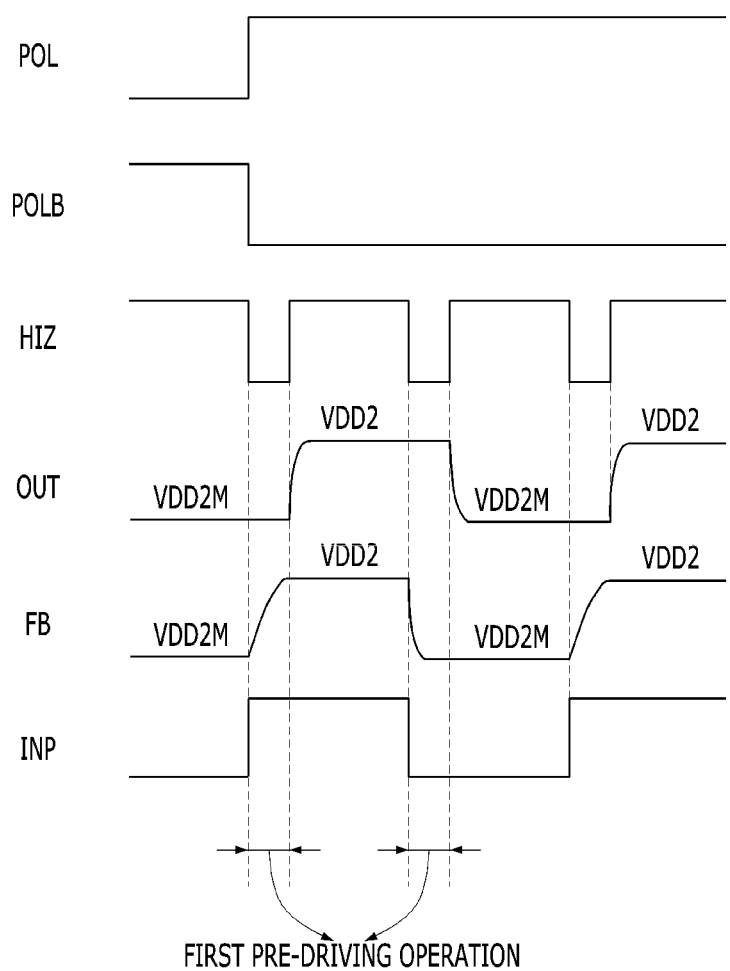

HALF-POWER BUFFER AMPLIFIER, DATA DRIVER AND DISPLAY APPARATUS INCLUDING THE SAME

This application claims the benefit of Korean Patent Application No. 10-2018-0089809, filed on Aug. 1, 2018, which is hereby incorporated by reference as if fully set forth herein.

BACKGROUND OF THE INVENTION

Field of the Invention

Embodiments of the present invention relate to a half-power buffer amplifier, a data driver and a display apparatus including the same.

Discussion of the Related Art

A display driver IC (DDI) serves to provide data as an electrical signal to display characters or images on a screen.

In order to drive the pixels of a display panel, an output terminal of the DDI includes a large number of output buffers. Power consumption by the large number of output buffers increases the temperature of the DDI, which may shorten the lifespan of the DDI. In order to reduce power consumption of the output buffers of the DDI, half-power output buffers are being used.

FIG. 7 shows a conventional half-power output buffer.

Referring to FIG. 7, the conventional half-power output buffer may include a first buffer 11 having a first operation region VDD2M to VDD2 and a second buffer 12 having a second operation region VSS2 to VDD2M. In addition, the half-power output buffer may include an output multiplexer (MUX) 15 configured to selectively output an output signal OUT1 from the first buffer 11 and an output signal OUT2 from the second buffer 12 based on or in response to a polarity control signal POL. In order to enable the output of the output multiplexer 15 to have a high slew rate, an on-resistance (Ron) of the output multiplexer 15 should be reduced. In order to reduce the on-resistance of the output multiplexer 15, the size of a transistor implementing a switch in the output multiplexer should be increased.

Offsets generated from the different buffers 11 and 12 may not be appropriately removed, thereby lowering display quality. For example, if the offset directions of the first buffer 11 and the second buffer 12 are opposite from each other, the offset characteristics may accumulate. In order to satisfy offset performance, a matching pair of transistors may be provided. By increasing the size of the matching pair of transistors, it may be possible to improve the offset characteristics. However, in this case, chip area may increase.

SUMMARY OF THE INVENTION

Accordingly, embodiments of the present invention are directed to a half-power buffer amplifier, a data driver and a display apparatus including the same that substantially obviate one or more problems due to limitations and/or disadvantages of the related art.

An object of certain embodiments is to provide a half-power buffer amplifier, a data driver and a display apparatus including the same, which are capable of improving a voltage slew rate of an output node by pre-driving (e.g., a signal to be output at the output node) and achieving low power.

Additional advantages, objects, and features of the invention will be set forth in part in the description which follows and in part will become apparent to those skilled in the art upon examination of the following or may be learned from practice of the invention. The objectives and other advantages of the invention may be realized and attained by the structure(s) particularly pointed out in the written description and claims hereof as well as the appended drawings.

To achieve these objects and other advantages and in accordance with the purpose(s) of various embodiments as embodied and broadly described herein, the half-power buffer amplifier includes (i) an amplification unit including first and second nodes, the amplification unit being configured to differentially amplify a differential input signal and to output a differentially amplified output signal, (ii) a first output unit including a first buffer unit including a first transistor and a second transistor between a first power source having a first voltage and a second power source having a second voltage, a second buffer unit including a third transistor and a fourth transistor between the first power source and the second power source, and a first switch unit between the first buffer unit and the second buffer unit, and (iii) a second output unit including a third buffer unit including a fifth transistor and a sixth transistor between the second power source and a third power source having a third voltage, a fourth buffer unit including a seventh transistor and an eighth transistor between the second power source and the third power source, and a second switch unit between the third buffer unit and the fourth buffer unit. Each of the first to third buffer units receives the differentially amplified output signal. The first switch unit includes a first switch between a gate of the first transistor and a gate of the third transistor, a second switch between a first connection node between the first transistor and the second transistor and a second connection node between the third transistor and the fourth transistor, and a third switch between a gate of the second transistor and a gate of the fourth transistor. Each of the first to third switches is turned on or off based on or in response to a pre-driving control signal.

The half-power buffer amplifier may further include an output node connected to the second connection node (i.e., between the third transistor and the fourth transistor) and a third connection node between the seventh transistor and the eighth transistor.

The first output unit may further include a first connection switch between the first node and the gate of the first transistor, a second connection switch between the second node and the gate of the second transistor, a first drive switch between the first power source and the gate of the first transistor, and a second drive switch between the third power source and the gate of the second transistor.

The first voltage may be greater than the second voltage, and the second voltage may be greater than the third voltage.

The first and second connection switches may be turned on or off by a first polarity control signal, and the first and second drive switches may be turned on or off by a second polarity control signal, which may be an inverted first polarity control signal.

The second output unit may further include a third connection switch between the first node and a gate of the fifth transistor, a fourth connection switch between the second node and a gate of the sixth transistor, a third drive switch between the first power source and the gate of the fifth transistor, and a fourth drive switch between the third power source and the gate of the sixth transistor.

The third and fourth connection switches may be turned on or off by the second polarity control signal, and the third and fourth drive switches may be turned on or off by the first polarity control signal.

The second switch unit may include a fourth switch between a gate of the fifth transistor and a gate of the seventh transistor, a fifth switch between a fourth connection node between the fifth transistor and the sixth transistor and the third connection node (i.e., between the seventh transistor and the eighth transistor), and a sixth switch between a gate of the sixth transistor and a gate of the eighth transistor. Each of the fourth to sixth switches may be turned on or off based on or in response to the pre-driving control signal.

A voltage of a pre-driving node may transition to a target voltage when the first to sixth switches are turned off, a voltage of the output node may transition to the target voltage when the first to sixth switches are turned on, and the pre-driving node may be connected to the first connection node (i.e., between the first transistor and the second transistor) and the fourth connection node (i.e., between the fifth transistor and the sixth transistor).

The amplification unit may include (i) a differential amplifier configured to differentially amplify the differential input signal and to generate first to fourth currents based on or in response to the differential input signal, (ii) a first current mirror configured to receive the first and second differential currents and the first power source, (iii) a second current mirror configured to receive the third and fourth differential currents and the third power source, and (iv) a bias unit between the first current mirror and the second current mirror.

The amplification unit may further include a first offset transistor between the first current mirror and the bias unit that operates based on or in response to a first bias signal.

The amplification unit may further include a second offset transistor between the second current mirror and the bias unit that operate based on or in response to a second bias signal.

According to another aspect of the present invention, the data driver includes (i) a latch unit configured to store data, (ii) a level shifter unit configured to convert a voltage level of the data from the latch unit, (iii) a digital-to-analog conversion unit configured to convert an output (e.g., the level-converted data signal) from the level shifter unit into an analog signal, and (iv) an output buffer configured to amplify and output the analog signal. The output buffer may include the above-described half-power buffer amplifier.

According to another aspect of the present invention, a display apparatus includes (i) a display panel including gate lines, data lines, and pixels connected to the gate lines and the data lines, the pixels being in a matrix including rows and columns, the above-described data driver configured to drive the data lines, and a gate driver configured to drive the gate lines.

It is to be understood that both the foregoing general description and the following detailed description of embodiments are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle(s) of the invention. In the drawings:

FIG. 4A is a timing chart for polarity control signals, a pre-driving control signal, the voltage at an output node, the voltage on a pre-driving node, and an input signal for the positive operation of the output unit;

DETAILED DESCRIPTION OF THE INVENTION

Figure 1A:
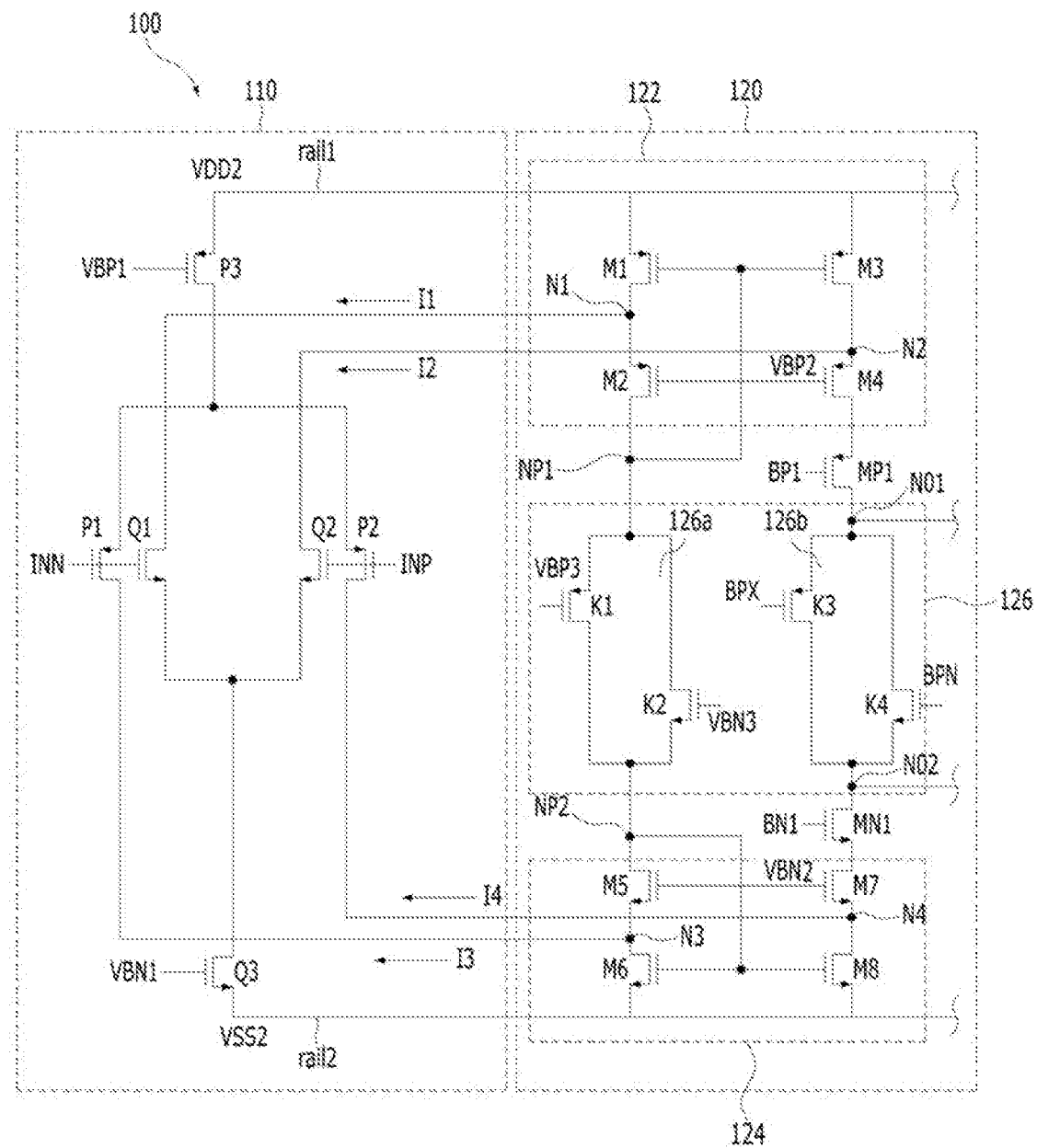
FIG. 1A is a diagram showing an exemplary input unit and an exemplary amplification unit of a half-power buffer amplifier according to one or more embodiments.

Reference will now be made in detail to embodiments of the present invention, examples of which are illustrated in the accompanying drawings.

In the following description of various embodiments, it will be understood that, when an element is referred to as being "on" or "under" another element, it can be directly on or under another element or can be indirectly on or under the other element with one or more intervening elements therebetween. Furthermore, when the expression "on" or "under" is used herein, it may include the upward direction and the downward direction with reference to an element.

In addition, it will be understood that relative terms used hereinafter such as "first" and "second", "on"/"above"/ "over" and "under"/"below"/"beneath" may be construed only to distinguish one element from another element without necessarily requiring or involving a certain physical or logical relation or sequence between the elements. In addition, the same reference numerals will be used throughout the drawings to refer to the same or like parts.

The terms "including", "comprising", "having" and variations thereof disclosed herein mean "including at least the following" unless expressly specified otherwise, and, as such, should not be construed to exclude elements other than the elements disclosed herein. In addition, the terms "corresponding" and variations thereof disclosed herein may involve at least one of the meanings of "facing," "overlapping" and "in a unique or 1:1 relationship with."

Figure 1B:
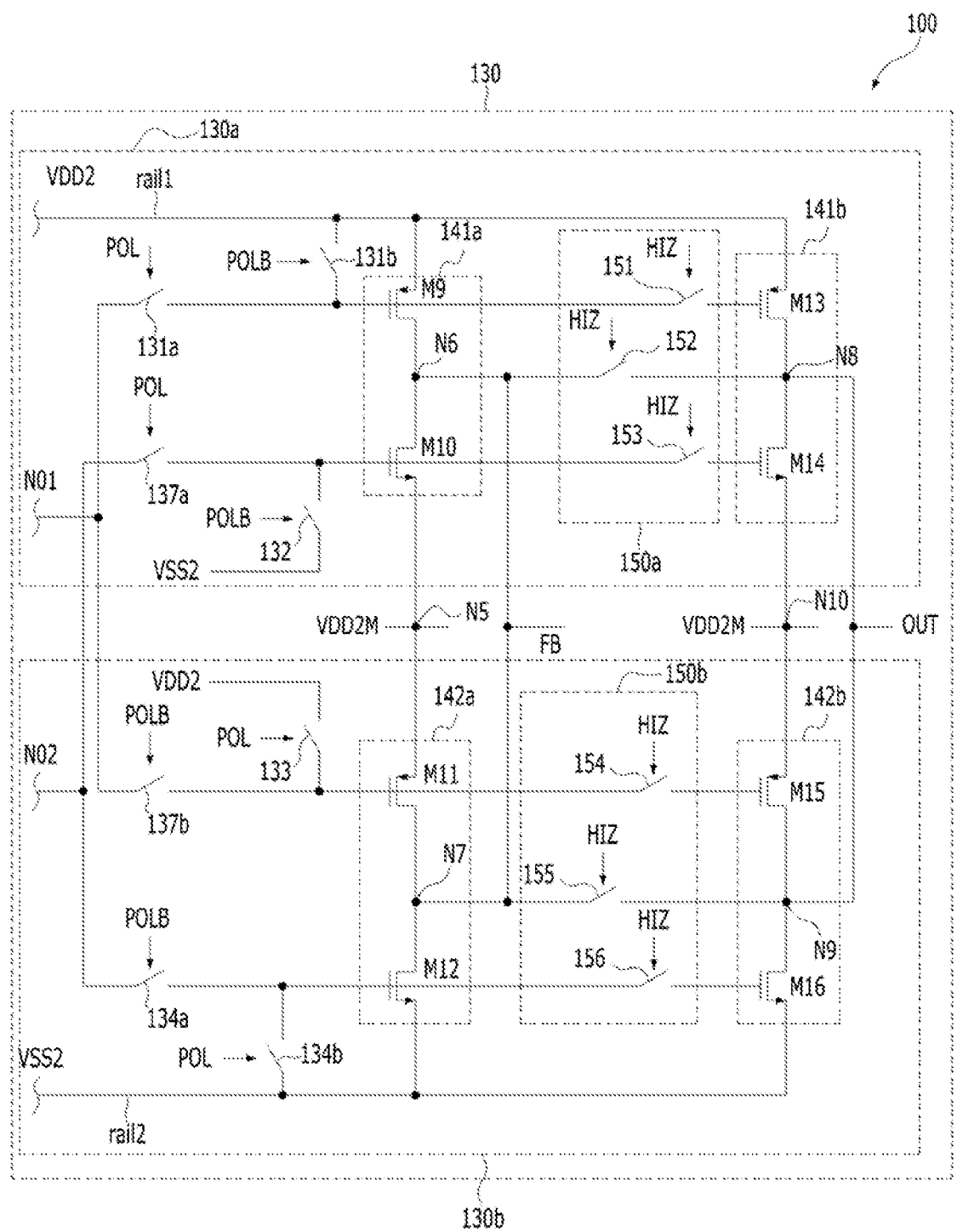
FIG. 1B is a diagram showing an exemplary output unit of a half-power buffer amplifier according to one or more embodiments.

FIG. 1A is a diagram showing an exemplary input unit 110 and an exemplary amplification unit 120 of a half-power buffer amplifier 100 according to one or more embodiments, and FIG. 1B is a diagram showing an exemplary output unit 130 of the half-power buffer amplifier 100 according to one or more embodiments.

That is, the half-power buffer amplifier 100 may include the input unit 110, the amplification unit 120, and the output unit 130. The input unit 110 and the amplification unit 120 may be referred to as a "first output terminal", and the output unit 130 may be referred to as a "second output terminal".

Figure 7:
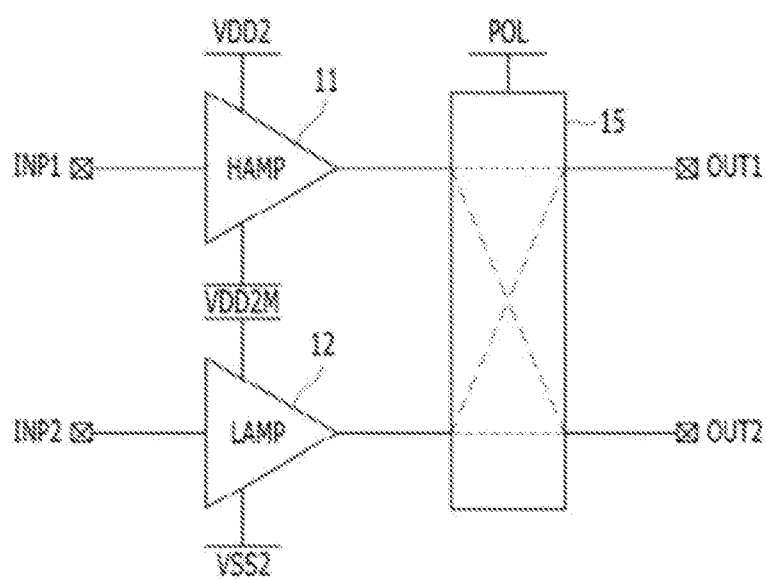
FIG. 7 is a diagram showing a conventional half-power output buffer.

The half-power buffer amplifier may be implemented by a rail-to-rail amplifier. For example, according to various embodiments, accumulation of the offsets of the first buffer 11 (FIG. 7) and the second buffer 12 (FIG. 7) may be mitigated by the "first output terminal" and the "second output terminal" of the half-power buffer amplifier.

A "rail" may refer to a highest level (e.g., VDD2) or a lowest level (e.g., VSS2) of a supplied voltage. The rail-to-rail amplifier may be an operational amplifier, to which a full-range voltage (e.g., VSS2 to VDD2) is supplied. The input voltage level may be within the full range of the supplied voltage(s).

A data driver of a liquid crystal display apparatus may include one or more half-power buffer amplifiers 100 shown in FIGS. 1A-B. The half-power buffer amplifier 100 may generate an output OUT configured to drive adjacent channels of a display panel driven by the data driver. For example, a "channel" may refer to a data line of a data driver configured to drive the pixels of the display panel.

The input unit 110 may be a complementary differential amplifier. For example, the input unit 110 may include a folded cascode operational transconductance amplifier (OTA).

The input unit 110 may differentially amplify the input signal INP INN and generate first to fourth currents I1, I2, I3 and I4 based or in response to the differential input signal INP/INN.

The input unit 110 may include a differential amplifier.

For example, the differential amplifier may include a first N-type transistor Q1 and a second N-type transistor Q2 having a common source configuration, and a first bias unit Q3 connected to a second rail rail2 to control the amount of current supplied to the common source of the first and second N-type transistors Q1 and Q2 in response to a first bias voltage VBN1.

The first bias unit Q3 may include an N-type transistor including a gate that receives the first bias voltage VBN1 as an input, and source and drain terminals connected to the second rail rail2 and the common source of the first and second N-type transistors Q1 and Q2. The second rail rail2 may supply a ground potential (e.g., VSS2).

For example, the differential amplifier may further include a first P-type transistor P1 and a second P-type transistor P2 having a common source configuration, and a second bias unit P3 connected to a first rail rail1 to control the amount of current supplied to the common source of the first and second P-type transistors P1 and P2 in response to a second bias voltage VBP1.

The second bias unit P3 may include a P-type transistor including a gate that receives the second bias voltage VBP1 as an input, and source and drain terminals connected to the first rail rail1 and the common source of the first and second P-type transistors P1 and P2.

The first rail rail1 may supply a first voltage (e.g., VDD2) higher than the voltage VSS2.

A first part INN of the differential input signal may be supplied to the gate of each of the first N-type transistor Q1 and the first P-type transistor P1. A second, complementary part INP of the differential input signal may be supplied to the gate of each of the second N-type transistor Q2 and the second P-type transistor P2.

The drains of the first and second N-type transistors Q1 and Q2 may be connected to a corresponding one of the first and second input nodes N1 and N2 of a first current mirror 122.

The drains of the first and second P-type transistors P1 and P2 may be connected to a corresponding one of the third and fourth input nodes N3 and N4 of a second current mirror 124.

For example, a first current I1 may be a current that flows between the drain of the first N-type transistor Q1 and the first input node N1, a second current I2 may be a current that flows between the drain of the second N-type transistor Q2 and the second input node N2, a third current I3 may be a current that flows between the drain of the first P-type transistor P1 and the third input node N3, and a fourth current I4 may be current that flows between the drain of the second P-type transistor P2 and the fourth input node N4.

The amplification unit 120 may include the first current mirror 122, the second current mirror 124, a third bias unit 126, a first offset transistor MP1 and a second offset transistor MN1. The first and second current mirrors 122 and 124 may each comprise a cascode current mirror. In addition, the amplification unit 120 may include a first node N01 configured to output a first output and a second node N02 configured to output a second output.

The first current mirror 122 may include first and second transistors M1 and M2 connected in series at the first input node N1 and third and fourth transistors M3 and M4 connected in series at the second input node N2. The first input node N1 carries the first current I1, and the second input node N2 carries the second current I2.

The second current mirror 124 may include fifth and sixth transistors M5 and M6 connected in series at the third input node N3 and seventh and eighth transistors M7 and M8 connected in series at the fourth input node N4. The third input node N3 carries the third current I3, and the fourth input node N4 carries the fourth current I4.

The third bias unit 126 may be between the first current mirror 122 and the second current mirror 124.

The first current mirror 122 controls the voltage at the first node N01 based on or in response to the first and second currents I1 and I2 and the bias voltage VBP2.

For example, the first current mirror 122 may include the first and second transistors M1 and M2 connected in series between the first voltage VDD2 and a first intermediate node NP1, the third transistor M3 between the first voltage VDD2 and the second input node N2, and the fourth transistor M4 between the second input node N2 and the first node N01. The first and second transistors M1 and M2 may be connected to each other at the first input node N1.

The gates of the first and third transistors M1 and M3 may be connected to each other, and to the first intermediate node NP1. For example, the connection node between the gate of the first transistor M1 and the gate of the third transistor M3 may be connected to the first intermediate node NP1.

The gates of the second and fourth transistors M2 and M4 may be connected to each other, and the bias voltage VBP2 may be provided to the connection node between the gates of the second and fourth transistors M2 and M4.

For example, the first current mirror 122 may include the first and second transistors M1 and M2 connected in series between the first rail rail1 and the first intermediate node NP1 and the third and fourth transistors M3 and M4 connected in series between the first rail rail1 and the first node N01.

The gate of the first transistor M1 may be connected to the gate of the third transistor M3, the gate of the second transistor M2 may be connected to the gate of the fourth transistor M4, and the gate of the first transistor M1 may be connected to the drain of the second transistor M2.

The second current mirror 124 controls the voltage of the second node N02 based on or in response to the third and fourth currents I3 and I4 and the bias voltage VBN2.

For example, the second current mirror 124 may include the fifth and sixth transistors M5 and M6 connected in series between the third voltage VSS2 and a second intermediate node NP2, the seventh transistor M7 between the fourth input node N4 and the fourth node NO4, and the eighth transistor M3 between the third voltage VSS2 and the fourth input node N4 provided with the fourth differential current I4. The fifth and sixth transistors M5 and M6 may be connected to each other at the third input node N3.

The gates of the fifth and seventh transistors M5 and M7 may be connected to each other, and the bias voltage VBN2 may be supplied to the connection node between the gates of the fifth and seventh transistors M5 and M7.

The gates of the sixth and eighth transistors M6 and M8 may be connected to each other, and the connection node of the gate of the fifth transistor M5 and the gate of the eighth transistor M8 may be connected to the second intermediate node NP2.

The second current mirror 124 may include the fifth and sixth transistors M5 and M6 connected in series between the second rail rail2 and the second intermediate node NP2, and the seventh and eighth transistors M7 and M8 connected in series between the second rail rail2 and the fourth node N04.

The gate of the fifth transistor M5 may be connected to the gate of the seventh transistor M7, the gate of the sixth transistor M6 may be connected to the gate of the eighth transistor M8, and the gate of the sixth transistor M6 may be connected to the drain of the fifth transistor M5.

The first intermediate node NP1 may be a connection node between the first current mirror 122 and the third bias unit 126, and the second intermediate node NP2 may be a connection node between the second current mirror 124 and the third bias unit 126.

For example, the first intermediate node NP1 may be the connection node between the second transistor M2 and a first bias circuit 126a, and the second intermediate node NP2 may be the connection node between the fifth transistor M5 and the first bias circuit 126a.

The first input node N1 of the first current mirror 122 may be the connection node between the first transistor M1 and the second transistor M2 connected in series, and the second input node N2 of the first current mirror 122 may be the connection node between the third transistor M3 and the fourth transistor M4 connected in series.

The third input node N3 of the second current mirror 124 may be the connection node between the fifth transistor M5 and the sixth transistor M6 connected in series, and the fourth input node N4 of the second current mirror 124 may be the connection node between the seventh transistor M7 and the eighth transistor M8 connected in series.

The third bias unit 126 may also be referred to as a floating current source, and may include the first bias circuit 126a and a second bias circuit 126b.

The first bias circuit 126a may be between the second transistor M2 of the first current mirror 122 and the fifth transistor M5 of the second current mirror 124.

The second bias circuit 126b may be between the fourth transistor M4 of the first current mirror 122 and the seventh transistor M7 of the second current mirror 124.

The first bias circuit 126a may include a P-type transistor K1 and an N-type transistor K2 connected in parallel. The sources and drains of the P-type transistor K1 and the N-type transistor K2 of the first bias circuit 126a may be connected to the first intermediate node NP1 and the second intermediate node NP2.

A bias voltage VBP3 may be provided to the gate of the P-type transistor K1 of the first bias circuit 126a, and a bias voltage VBN3 may be provided to the gate of the N-type transistor K2.

The second bias circuit 126b may include a P-type transistor K3 and an N-type transistor K4 connected in parallel between the first node N01 and the second node N02.

A bias voltage BPX may be provided to the gate of the P-type transistor K3 of the second bias circuit 126b, and a bias voltage BPN may be provided to the gate of the N-type transistor N4 of the second bias circuit 126b.

The first node N01 may be a connection node between a first offset transistor MP1 (e.g., the drain of MP1), the P-type transistor K3 (e.g., the source of K3) and the N-type transistor (K4) (e.g., the drain of K4) of the second bias circuit 126b.

The second node N02 may be a connection node between a second offset transistor MN1 (e.g., the drain of MN1), the P-type transistor K3 (e.g., the drain of K3) and the N-type transistor K4 (e.g., the source of K4) of the second bias circuit 126b.

The first offset transistor MP1 may be between the first current mirror 122 and the second bias circuit 126b and may operate based on or in response to the bias voltage BP1. A voltage between the source and the drain of the first offset transistor MP1 may maintain a predetermined constant voltage.

The second offset transistor MN1 may be between the second current mirror 124 and the second bias circuit 126b and may operate based on or in response to the bias voltage BN1. A voltage between the source and the drain of the second offset transistor MN1 may maintain a predetermined constant voltage.

The first offset transistor MP1 and the second offset transistor MN1 may comprise transistors having opposite polarities. For example, the first offset transistor MP1 may be a P-type transistor (e.g., a PMOS transistor), and the second offset transistor MN1 may be an N-type transistor (e.g., an NMOS transistor).

The first offset transistor MP1 may prevent the accuracy of the first current mirror 122 from deteriorating due to errors in the manufacturing process of the transistors (e.g., the first transistor M1 to the fourth transistor M4) in the first current mirror 122.

In addition, the second offset transistor MN1 may prevent the accuracy of the second current mirror 124 from deteriorating due to errors in the manufacturing process of the transistors (e.g., the fifth transistor M5 to the eight transistor M8) in the second current mirror 122.

That is, due to errors in the manufacturing process, the voltage between the source and the drain of the transistors (e.g., the first transistor M1 to the fourth transistor M4) configuring the first current mirror 122 may be different from a target voltage, thereby adversely affecting the accuracy of the first current mirror 122.

The first offset transistor MP1 may be controlled based on or in response to the bias voltage BP1, thereby controlling the current flowing through and/or the voltage across the first offset transistor MP1.

The first offset transistor MP1 may enable the potential of the drain of the second transistor M2 of the first current mirror 122 to be equal to that of the drain of the fourth transistor M4. Therefore, it is possible to prevent deterioration in the accuracy of the first current mirror 122 due to errors in the manufacturing process of the transistors (e.g., the first transistor M1 to the fourth transistor M4).

The second offset transistor MN1 may enable the potential of the drain of the fifth transistor M5 of the second current mirror 124 to be equal to that of the seventh transistor M7. Therefore, it is possible to prevent deterioration in the accuracy of the second current mirror 124 due to errors in the manufacturing process of the transistors (e.g., the fifth transistor M5 to the eighth transistor M8).

Referring to FIG. 1B, the output unit 130 may include a first output unit 130a, a second output unit 130b, and an output node OUT.

An inversion operation of the panel of the display apparatus based on or in response to polarity (e.g., a polarity control signal) may be performed by the first output unit 130a and the second output unit 130b.

The first output unit 130a may output a voltage having a first voltage range (e.g., VDD2M to VDD2), and may be referred to as a "positive" output unit.

The second output unit 130b may have a voltage having a second voltage range (VSS2 to VDD2M), and may be referred to as a "negative" output unit.

The first output unit 130a may include first and second connection switches 131a and 137a, a first drive switch 131b, a second drive switch 132, a first buffer unit 141a, a second buffer unit 141b, and a first switch unit 150a.

The first buffer unit 141a may include a transistor M9 and a transistor M10 between a first power source having the first voltage VDD2 and a second power source having the second voltage VDD2M.

For example, the transistor M9 may be a P-type transistor (e.g., a PMOS transistor) and the transistor M10 may be an N-type transistor (e.g., an NMOS transistor).

For example, the source of the transistor M9 may be connected to the first power source, the source of the transistor M10 may be connected to the second power source, and the drain of the transistor M9 and the drain of the transistor M10 may be connected to each other.

The second buffer unit 141b may include a transistor M13 and a transistor M14 between the first power source having the first voltage VDD2 and the second power source having the second voltage VDD2M.

For example, the transistor M13 may be a P-type transistor (e.g., a PMOS transistor), and the transistor M14 may be an N-type transistor (e.g., NMOS transistor).

For example, the source of the transistor M13 may be connected to the first power source, the source of the transistor M14 may be connected to the second power source, and the drain of the transistor M13 and the drain of the transistor M14 may be connected to each other.

The first connection switch 131a may be between the first node N01 and the gate of the transistor M9 of the first buffer unit 141a, and may be turned on or off based on or in response to a first polarity control signal POL.

The second connection switch 137a may be between the second node N02 and the gate of the transistor M10 of the first buffer unit 141a, and may be turned on or off based on or in response to the first polarity control signal POL.

The first drive switch 131b may be between the first power source and the gate of the transistor M9, and may be turned on or off based on or in response to a second polarity control signal POLB, which is the inverted first polarity control signal POL.

The second drive switch 132 may be between the third power source and the gate of the transistor M10, and may be turned on or off based on or in response to the second polarity control signal POLB.

For example, the first and second connection switches 131a and 137a and the first and second drive switches 131b may be transistors having the same polarity, for example, N-type transistors (e.g., NMOS transistors). However, the present invention is not limited thereto and the first and second connection switches 131a and 137a and the first and second drive switches 131b may be N-type or P-type transistors in other embodiments.

The second output unit 130b may include third and fourth connection switches 137b and 134a, a third drive switch 133, a fourth drive switch 134b, a third buffer unit 142a, a fourth buffer unit 142b, and a second switch unit 150b.

The third buffer unit 142a may include a transistor M11 and a transistor M12 between the second power source having the second voltage VDD2M and the third power source having the third voltage VSS2.

For example, the transistor M11 may be a P-type transistor (e.g., a PMOS transistor), and the transistor M12 may be an N-type transistor (e.g., NMOS transistor).

For example, the source of the transistor M11 may be connected to the second power source, the source of the transistor M12 may be connected to the third power source, and the drain of the transistor M11 and the drain of the transistor M12 may be connected to each other.

The fourth buffer unit 142b may include a transistor M15 and a transistor M16 between the second power source and the third power source.

For example, the transistor M15 may be a P-type transistor (e.g., a PMOS transistor), and the transistor M16 may be an N-type transistor (e.g., an NMOS transistor).

For example, the source of the transistor M15 may be connected to the second power source, the source of the transistor M16 may be connected to the third power source, and the drain of the transistor M15 and the drain of the transistor M16 may be connected to each other.

The third connection switch 137b may be between the first node N01 and the gate of the transistor M11 of the third buffer unit 142a, and may be turned on or off based on or in response to the second polarity control signal POLB.

The fourth connection switch 134a may be between the second node N02 and the gate of the transistor M12 of the third buffer unit 142a, and may be turned on or off based on or in response to the second polarity control signal POLB.

The third drive switch 133 may be between the first power source and the gate of the transistor M11 of the third buffer unit 142a, and may be turned on or off based on or in response to the first polarity control signal POL.

The fourth drive switch 134b may be between the third power source and the gate of the transistor M12 of the third buffer unit 142a and may be turned on or off based on or in response to the first polarity control signal POL.

For example, the third and fourth connection switches 137b and 134a and the third and fourth drive switches 133 and 134b may be transistors having the same polarity, for example, N-type transistors (e.g., NMOS transistors). However, the present invention is not limited thereto and the first and second connection switches 131a and 137a and the first and second drive switches 131b may be N-type or P-type transistors in other embodiments.

The transistor M10 of the first buffer unit 141a and the transistor M11 of the third buffer unit 142a may be connected to each other, and the second power source may be connected to the connection node N5 between the transistor M10 and the transistor M11.

In addition, the transistor M14 of the second buffer unit 141b and the transistor M15 of the fourth buffer unit 142b may be connected to each other, and the second power source may be connected to the connection node N10 between the transistor M14 and the transistor M15.

By selective switching of the first to fourth connection switches 131a, 137a, 137b and 134a and the first to fourth drive switches 131b, 132, 133 and 134b, one of the first output unit 130a and the second output unit 130b may be selectively turned on and the other thereof selectively turned off.

For example, based on or in response to the first and second polarity control signals POL and POLB, the first to fourth connection switches 131a, 137a, 137b and 134a and the first to fourth drive switches 131b, 132, 133 and 134b may be selectively turned on or off, thereby selectively operating one of the first output unit 130a and the second output unit 130b.

The first switch unit 150a may be between the first buffer unit 141a and the second buffer unit 141b. The first switch unit 150a may be configured to selectively connect the first buffer unit 141a to the second buffer unit 141b based on or in response to a pre-driving control signal HIZ.

For example, the first switch unit 150a may include a first switch 151 configured to selectively connect the gate of the transistor M9 of the first buffer unit 141a and the gate of the transistor M13 of the second buffer unit 141b based on or in response to the pre-driving control signal HIZ.

In addition, the first switch unit 150a may include a second switch 152 configured to selectively connect the connection node N6 between the transistor M9 and the transistor M10 of the first buffer unit 141a and the connection node N8 between the transistor M13 and the transistor M14 of the second buffer unit 141b based on or in response to the pre-driving control signal HIZ.

In addition, the first switch unit 150a may include a third switch 153 configured to selectively connect the gate of the transistor M10 of the first buffer unit 141a and the gate of the transistor M14 of the second buffer unit 141b based on or in response to the pre-driving control signal HIZ.

The second switch unit 150b may be between the third buffer unit 142a and the fourth buffer unit 142b. The second switch unit 150b may be configured to selectively connect the third buffer unit 142a and the fourth buffer unit 142b based on or in response to the pre-driving control signal HIZ.

For example, the second switch unit 150b may include a fourth switch 154 configured to selectively connect the gate of the transistor M11 of the third buffer unit 142a and the gate of the transistor M15 of the fourth buffer unit 142b based on or in response to the pre-driving control signal HIZ.

In addition, the second switch unit 150b may include a fifth switch 155 configured to selectively connect the connection node N7 between the transistor M11 and the transistor M12 of the third buffer unit 142a and the connection node N9 between the transistor M15 and the transistor M16 of the second buffer unit 142b based on or in response to the pre-driving control signal HIZ.

In addition, the second switch unit 150b may include a sixth switch 156 configured to selectively connect the gate of the transistor M12 of the third buffer unit 142a and the gate of the transistor M16 of the fourth buffer unit 142b based on or in response to the pre-driving control signal HIZ.

The output node OUT of the output unit 130 may be a node configured to connect the connection node N8 of the second buffer unit 141b and the connection node N9 of the fourth buffer unit 142b, without being limited thereto. In other embodiments, the output unit 130 may have a first output node (e.g., the first output node N8) and a second output node (e.g., the second output node N9) separate from each other.

The first switch unit 150a and the second switch unit 150b enable a pre-driving process or operation. For example, the switches 151 to 156 of the first and second switch units 150a and 150b may be turned off during the pre-driving process or operation, and the switches 151 to 156 of the first and second switch units 150a and 150b may be turned on during normal operation of outputting the output signal to the output node OUT after the pre-driving process or operation ends.

Figure 2A:
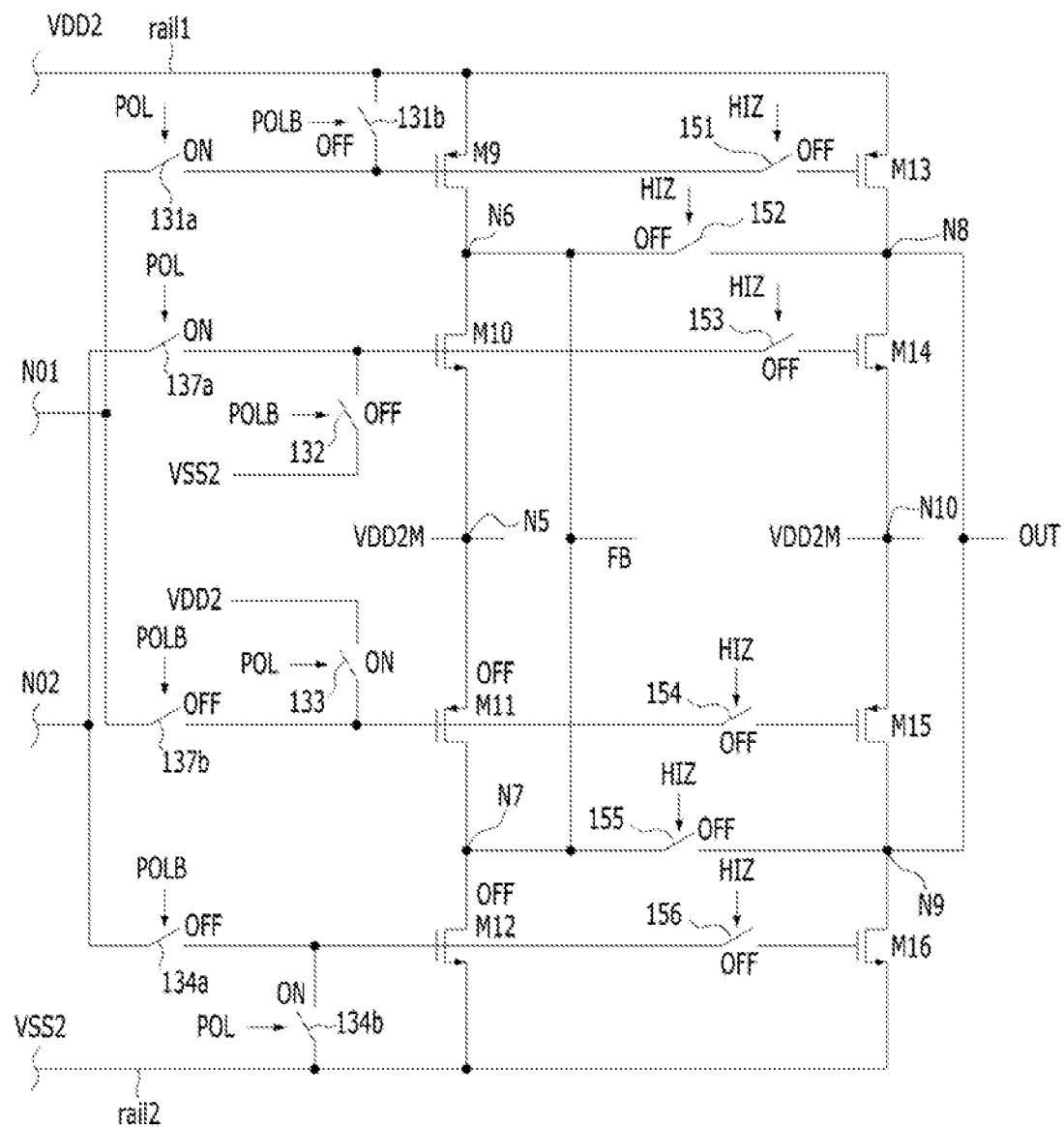
FIG. 2A is a diagram showing the operation state of the output unit for a first pre-driving process during a positive operation.

FIG. 2A shows the operation state of the output unit for a first pre-driving process during a positive operation. Here, a "positive" operation refers to an operation in which the first output unit 130a is turned on and the second output unit 130b is turned off, and the output node OUT may output a voltage in a first voltage range VDD2M to VDD2.

Referring to FIG. 2A, by the first and second polarity control signals POL and POLB, the first and second connection switches 131a and 137a may be turned on, the third and fourth connection switches 137b and 134a may be turned off, and the third and fourth buffer units 142a and 142b may be turned off.

Accordingly, the voltage of the connection node FB in the output unit 130 of FIG. 1B may be controlled by (i) the transistor M9 in the first buffer unit 141a, based on or in response to the voltage of the first node N01, and (ii) the transistor M10 of the first buffer unit 141a, of FIG. 1B controlled based on or in response to the voltage of the second node N02, and may have a voltage in the first voltage range VDD2M to VDD2.

The connection node FB in the output unit 130 may be a node configured to connect the connection node N6 of the first buffer unit 141a and the connection node N7 of the third buffer unit 142a, and may be referred to as a "pre-driving node".

Based on or in response to the pre-driving control signal HIZ, the first switch unit 150a and the second switch unit 150b may be turned off, the first buffer unit 141a and the second buffer unit 141b may be electrically separated from each other, and the third buffer unit 142a and the fourth buffer unit 142b may be electrically separated from each other.

Since the first buffer unit 141a and the second buffer unit 141b are electrically separated from each other, the connection node FB in the output unit 130 in FIG. 1B may be separated from the output node OUT, thereby increasing the slew rate of the voltage of the connection node FB in the output unit 130. Since the output node OUT is connected to the display panel, the load (e.g., an impedance of the output node OUT) is very high.

That is, since the connection node FB in the output unit 130 may not be influenced by the load of the display panel due to the first and second switch units 150a and 150b, the connection node FB in the output unit 130 may reach a desired target voltage (e.g., VDD2 or VDD2M) at a high slew rate. This is referred to as a "first pre-driving" process or operation.

Figure 2B:
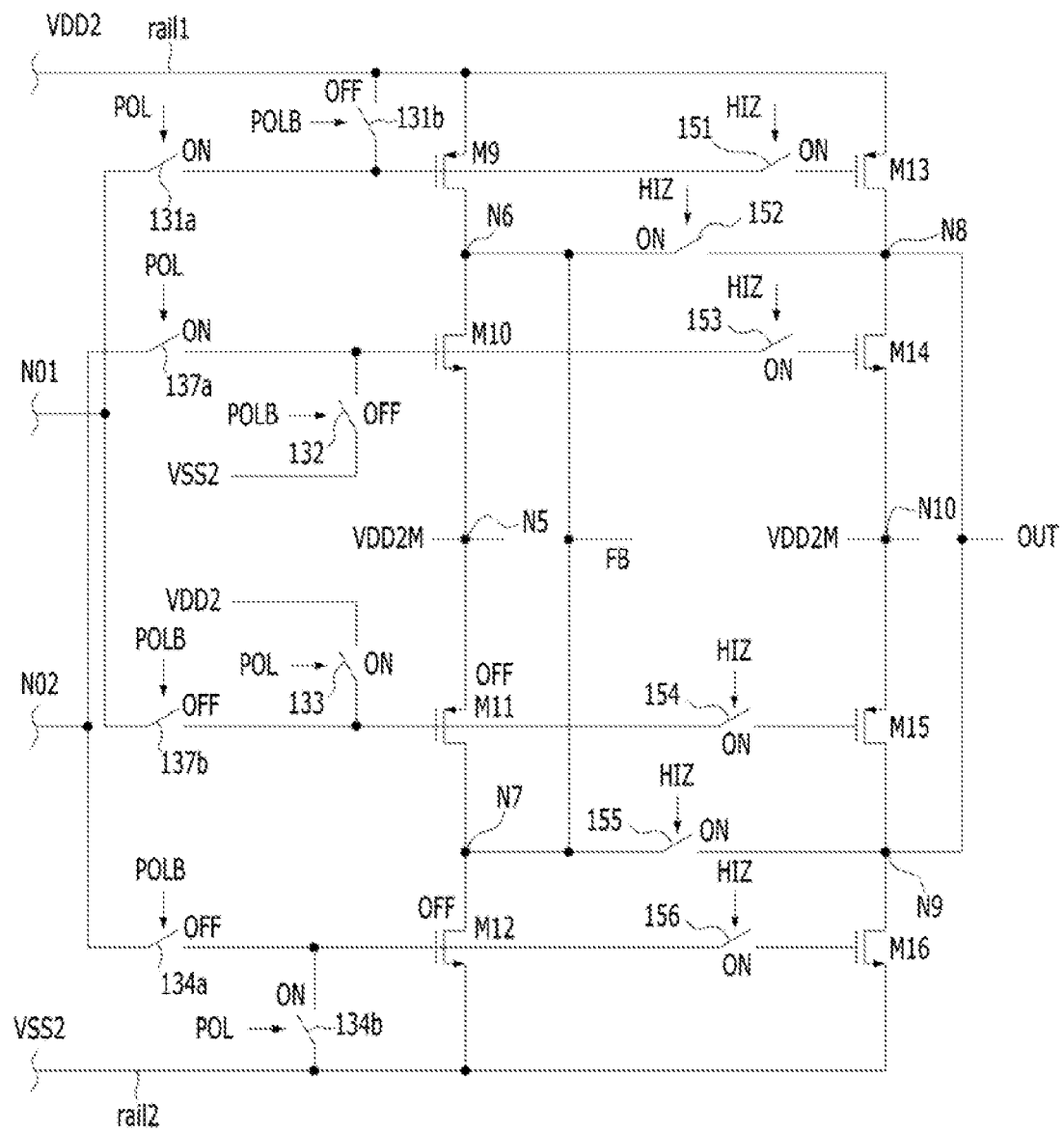
FIG. 2B is a diagram showing the operation state of the output unit for the positive operation after the first pre-driving process ends.

FIG. 2B shows the operation state of the output unit 130 in FIG. 1B for the positive operation after the first pre-driving process or operation ends.

Referring to FIG. 2B, for the positive operation, the switches 151 to 156 of the first and second switching units 150a and 150b in FIG. 1B may be turned on based on or in response to the pre-driving control signal HIZ, the first buffer unit 141a and the second buffer unit 141b may be connected to each other, and the output node OUT of the output unit 130 of FIG. 1B may be connected to the pre-driving node FB by the turned-on second switch 152. Since the pre-driving node FB has already reached the target voltage (e.g., VDD2 or VDD2M), the output node OUT of the output unit 130 may rapidly reach the target voltage. That is, the slew rate on the voltage of the output node OUT of the output unit 130 can be improved.

Figure 3A:
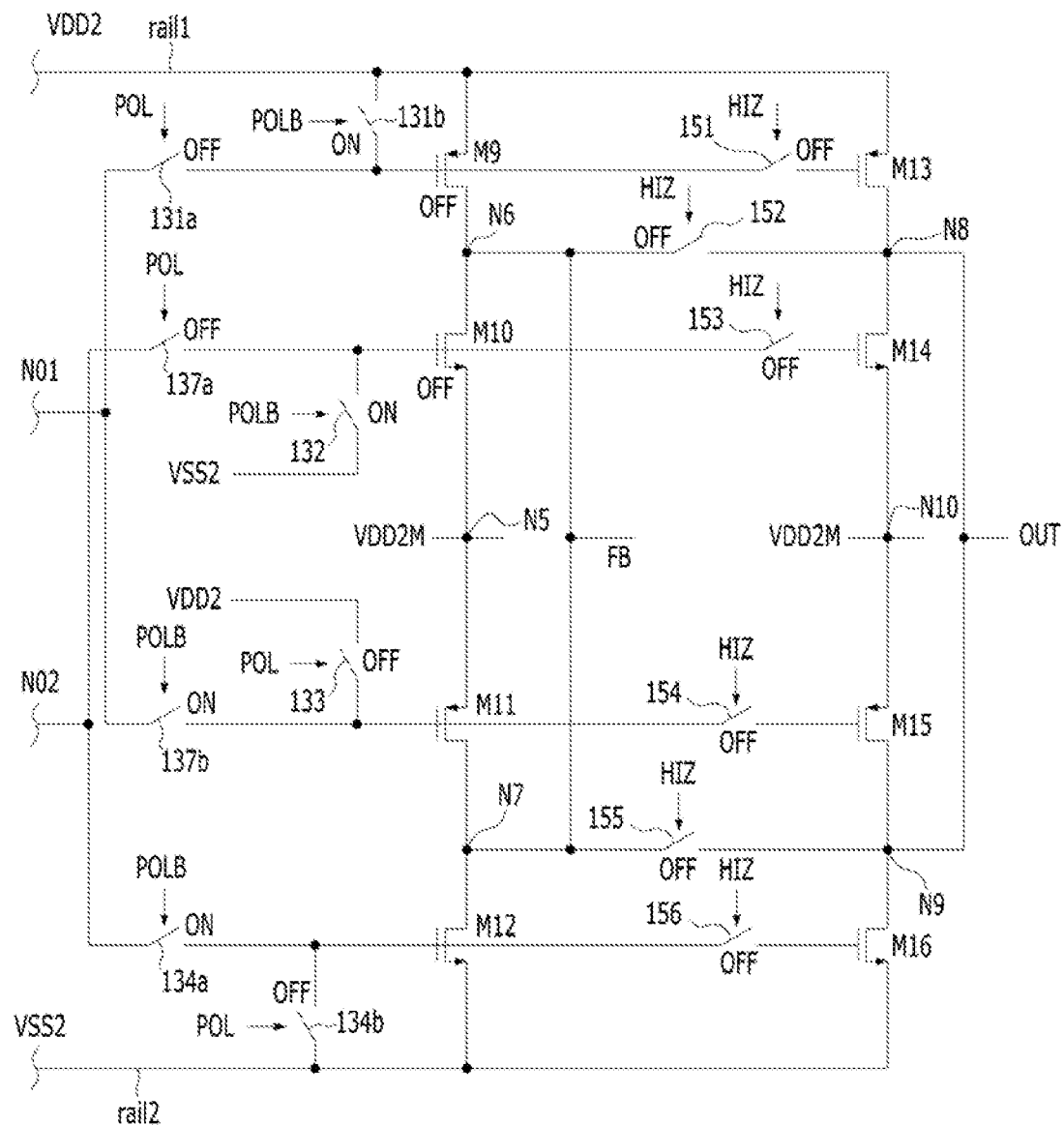
FIG. 3A is a diagram showing the operation state of the output unit for a second pre-driving process during a negative operation.

FIG. 3A is a view showing the operation state of the output unit 130 of FIG. 1B for a second pre-driving process or operation during a negative process or operation. Here, a "negative" process or operation is a process or operation in which the first output unit 130a is turned off and the second output unit 130b is turned on, and the output node OUT may output a voltage having a second voltage in the range VSS2 to VDD2M.

Referring to FIG. 3A, using the first and second polarity control signals POL and POLB, the first and second connection switches 131a and 137a may be turned on, the third and fourth connection switches 137b and 134a may be turned on, and the first and second buffer units 141a and 141b may be turned off.

Accordingly, the voltage of the connection node FB of the output unit 130 may be controlled by the transistor M11 in the third buffer unit 142a, based on or in response to the voltage of the first node N01, and the transistor M12 of the third buffer unit 142a, based on or in response to the voltage of the second node N02, and may have a voltage in the second voltage range VSS2 to VDD2M.

Based on or in response to the pre-driving control signal HIZ, the first switch unit 150a and the second switch unit 150b may be turned off, and the connection node FB of the output unit 130 may be separated from the output node OUT of the output unit 130, thereby increasing the slew rate of the voltage on the connection node FB of the output unit 130.

That is, since the connection node FB of the output unit 130 may not be influenced by the load of the display panel due to the first and second switch units 150a and 150b, the connection node FB of the output unit 130 may reach a desired target voltage (e.g., VSS or VDD2M) at a high slew rate. This is referred to as a "second pre-driving process or operation".

Figure 3B:
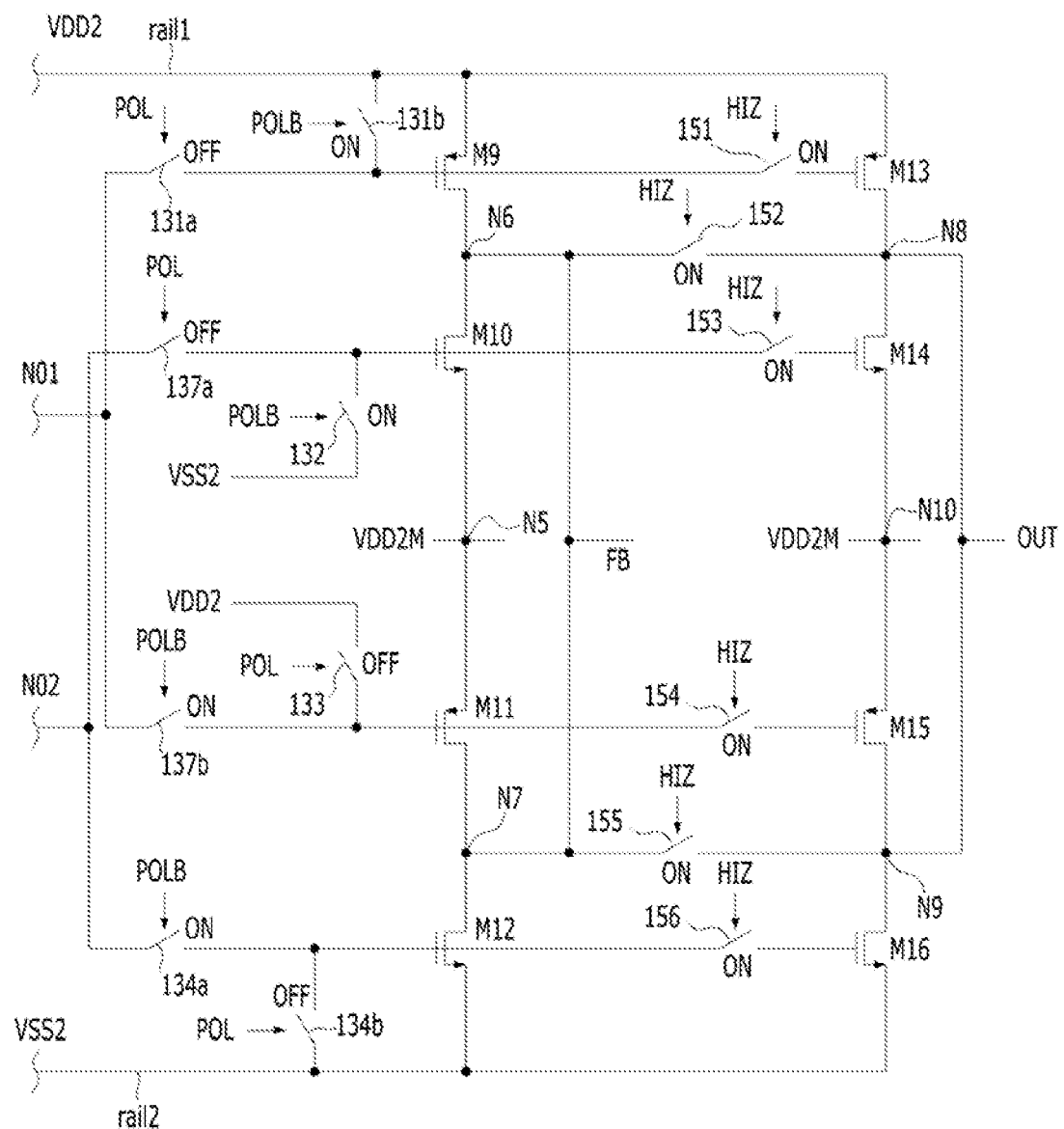
FIG. 3B is a diagram showing the operation state of the output unit for the negative operation after the second pre-driving process ends.

FIG. 3B is a diagram showing the operation state of the output unit 130 in FIG. 1B for the negative operation after the second pre-driving process or operation ends.

Referring to FIG. 3B, for the negative operation, based on or in response to the pre-driving control signal HIZ, the switches 151 to 156 of the first and second switching units 150a and 150b may be turned on, the third buffer unit 142a and the fourth buffer unit 142b may be connected to each other, and the output node OUT of the output unit 130 may be connected to the pre-driving node FB by the turned-on fifth switch 155.

Since the pre-driving node FB has already reached the target voltage (e.g., VSS2 or VDD2M), the output node OUT of the output unit 130 may rapidly reach the target voltage. That is, the slew rate of the voltage on the output node OUT of the output unit 130 can be improved.

FIG. 4A is a timing chart of the polarity control signal(s) POL and POLB, the pre-driving control signal HIZ, the voltage at the output node OUT, the voltage on the pre-driving node FB, and an input signal INP for positive operation of the output unit 130 in FIG. 1B.

Referring to FIG. 4A, when the pre-driving control signal HIZ has a first level (e.g., a "low level"), the first pre-driving process or operation may be performed, and the slew rate of the voltage on the pre-driving node FB may increase.

When the pre-driving control signal HIZ has a second level (e.g., a "high level"), normal positive operation may be performed, and the voltage at the output node OUT may rapidly reach the target voltage VDD2 or VDD2M, thereby improving the slew rate of the voltage at the output node OUT. For example, the slew rate of the voltage at the output node OUT may be greater than that of the voltage at the pre-driving node FB, without being limited thereto.

Figure 4B:
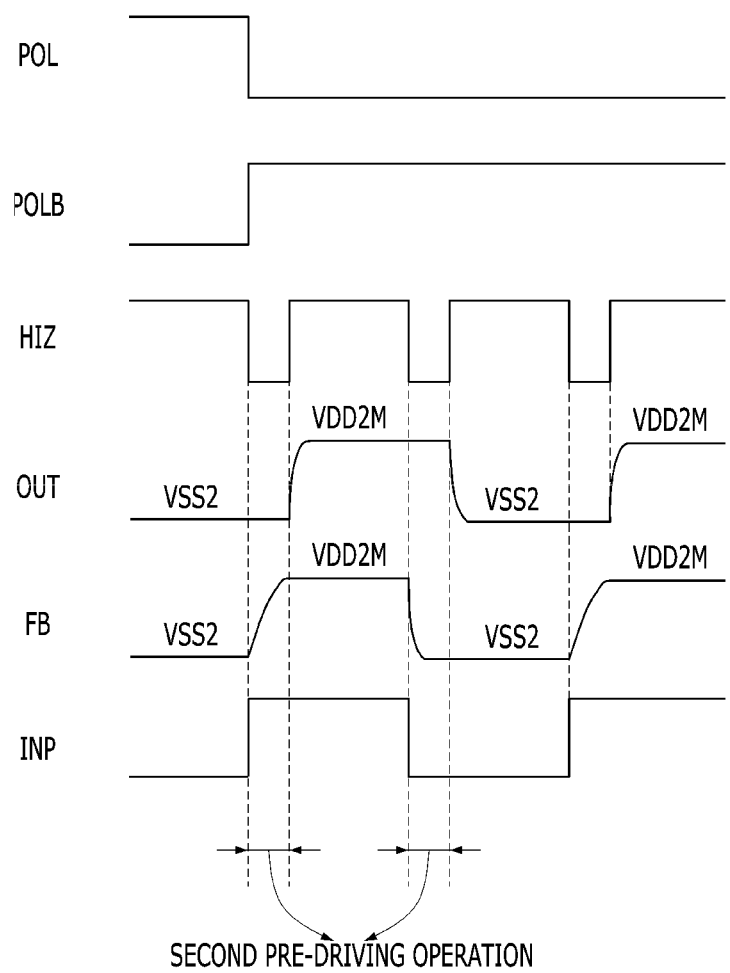
FIG. 4B is a timing chart for the polarity control signals, the pre-driving control signal, the voltage at the output node, the voltage on the pre-driving node, and the input signal for the negative operation of the output unit.

FIG. 4B is a timing chart of the polarity control signals POL and POLB, the pre-driving control signal HIZ, the voltage at the output node OUT, the voltage on the pre-driving node FB, and an input signal INP for negative operation of the output unit 130 in FIG. 1B.

Referring to FIG. 4B, when the pre-driving control signal HIZ has a first level (e.g., the low level), the second pre-driving process or operation may be performed, and the slew rate of the voltage on the pre-driving node FB may increase.

When the pre-driving control signal HIZ has a second level (e.g., the high level), the normal negative operation may be performed, and the voltage at the output node OUT may rapidly reach the target voltage VSS2 or VDD2M, thereby improving the slew rate at the voltage of the output node OUT.

As described above, one or more embodiments of the present invention have a structure capable of dot inversion using half power. In addition, since the input unit 110, the amplifier 120, and the first and second output units 130a and 130b are driven by half power, the embodiments of the present invention provide a low-power design using half power.

In addition, since the output multiplexer may not be present, embodiments of the present invention may allow a relatively small-area design.

In addition, since the embodiments have a pre-driving function, it is possible to enable the output of the output node OUT to have a high slew rate. Therefore, it is possible to reduce heat generated in the data driver.

In addition, according to embodiments of the present invention, the output unit 130 of FIG. 1B may satisfy offset performance without increasing the size of the transistors of a matching pair (e.g., by applying a full-power structure).

In addition, according to embodiments of the present invention, by providing the first and second transistors MP1 and MN1 (see, e.g., FIG. 1A), it is possible to reduce a systematic offset and to secure accuracy of the first and second current mirrors 122 and 124. In addition, a chopping circuit configured for offset correction and/or a signal configured to control the same, is/are not necessary.

Figure 5:
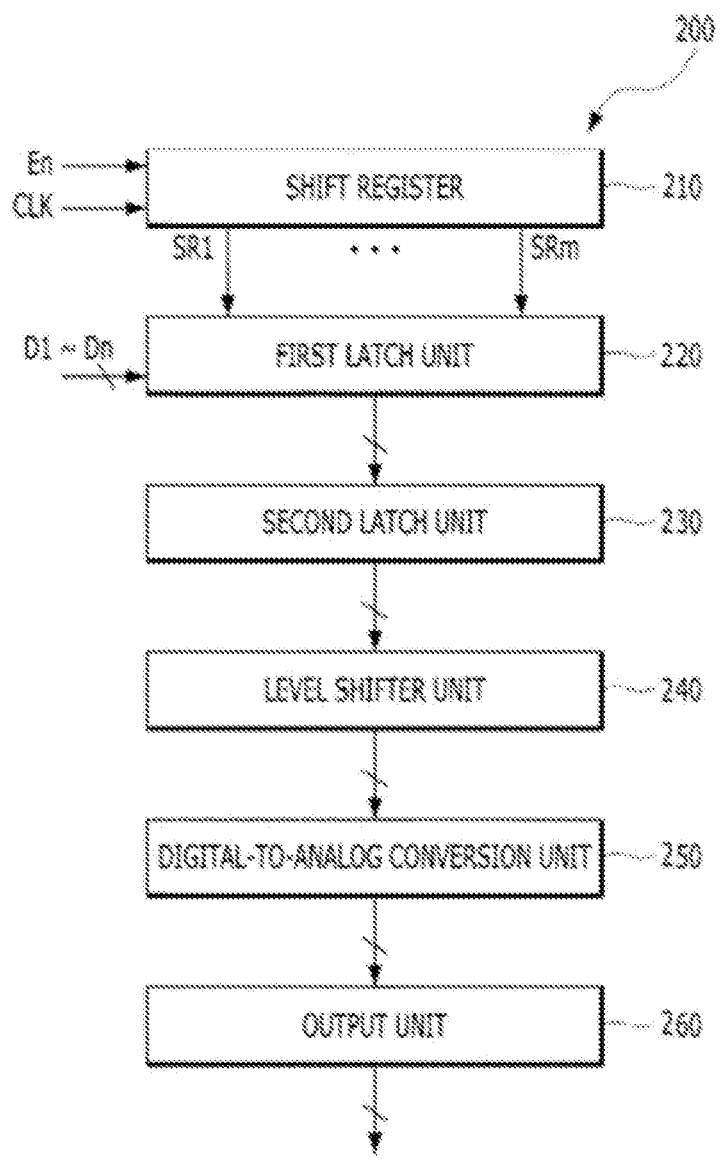
FIG. 5 is a schematic block diagram of an exemplary data driver according to one or more embodiments.

FIG. 5 is a schematic block diagram of a data driver 200 according to one or more embodiments of the present invention.

Referring to FIG. 5, the data driver 200 includes a shift register 210, a first latch unit 220, a second latch unit 230, a level shifter unit 240, a digital-to-analog converter 250 and an output unit 260.

The shift register 210 generates shift signals SR1 to SRm (m being a natural number greater than 1) in response to an enable signal EN and a clock signal CLK, in order to control the timing of data (e.g., digital image data) being sequentially stored in the first latch.

For example, the shift register 210 may receive a horizontal start signal from a timing controller (not shown) and shift the received horizontal start signal in response to the clock signal CLK, thereby generating the shift signals SR1 to SRm (m being a natural number greater than 1). Here, the horizontal start signal may be used interchangeably with a start pulse.

The first latch unit 220 may store data D1 to Dn (D being a natural number greater than 1) received from the timing controller (not shown) in response to the shift signals SR1 to SRm (m being a natural number greater than 1) generated by the shift register 210.

The first latch unit 220 may include a plurality of first latches (not shown), and the plurality of first latches may store the data D1 to Dn (D being a natural number greater than 1).

For example, the data received from the timing controller 205 may be red (R), green (G) and blue (B) data, and the first latches of the first latch unit 220 may store R, G and B data.

That is, the data D1 to Dn (D being a natural number greater than 1) received from the timing controller 205 in response to the shift signals SR1 to SRm (m being a natural number greater than 1) may be sequentially stored in the first latches in the first latch unit 220.

The second latch unit 230 stores data output from the first latch unit 220 in response to a control signal received from the timing controller 205.

For example, the second latch unit 230 may store the data from the first latch unit 220 in units of horizontal line periods.

For example, the horizontal line period may be a time period to store the data corresponding to one horizontal line 304 (see FIG. 6) of the display panel in the first latches of the first latch unit 220.

For example, the horizontal line period may be a period between a first point in time and a second point in time.

The first point in time may be a point in time when the data in the first latch unit 220 is transmitted to the second latch unit 230 in response to the horizontal line signal, and the data transmitted to the second latch unit 230 is input to the level shifter unit 240 and the digital-to-analog converter 250 to output a first analog signal. The second point in time may be a point in time when the data in the first latch unit 220 is transmitted to the second latch unit 230 in response to the horizontal line signal of a next period, and the data transmitted to the second latch unit 230 is input to the level shifter unit 240 and the digital-to-analog converter 250 to output a second analog signal.

Alternatively, the horizontal line period may be one period of the horizontal line signal.

The second latch unit 230 may include a plurality of second latches, and the number of second latches may be equal to the number of first latches.

The level shifter unit 240 may shift the voltage level of the data received from the second latch unit 230. For example, the level shifter unit 240 may convert a first voltage level of the data received from the second latch unit 230 to a second voltage level.

For example, the level shifter unit 240 may include a plurality of level shifters, and the number of level shifters may be equal to the number of the first latches and/or the number of second latches, without being limited thereto.

The digital-to-analog converter 250 converts the output, that is, digital data, of the level shifter 140 into an analog signal. For example, the digital-to-analog converter 250 may include a plurality of digital-to-analog converters corresponding to the plurality of level shifters.

For example, the digital-to-analog converter 250 may receive grayscale voltages from a voltage generator (not shown), and convert the output of the level shifter unit 240 into an analog signal.

The output unit 260 amplifies (and/or buffers) the analog signal output from the digital-to-analog converter 250 and outputs the amplified (and/or buffered) analog signal.

The output unit 260 may include amplifiers configured to amplify the analog signals output from the digital-to-analog converters. Additionally or alternatively, the output unit 260 may include buffers configured to buffer the analog signals output from the digital-to-analog converters.

The output unit 260 may include the half-power buffer amplifier according to the above-described embodiments. For example, the output unit 260 may include a plurality of half-power buffer amplifiers, and the plurality of half-power buffer amplifiers may amplify the analog signals output from the digital-to-analog conversion unit 250 and provide the amplified signals to any one of a plurality of data lines. For example, each of the plurality of half-power buffer amplifiers may be the half-power buffer amplifier 100 according to the embodiments of FIGS. 1A and 1B.

Figure 6:
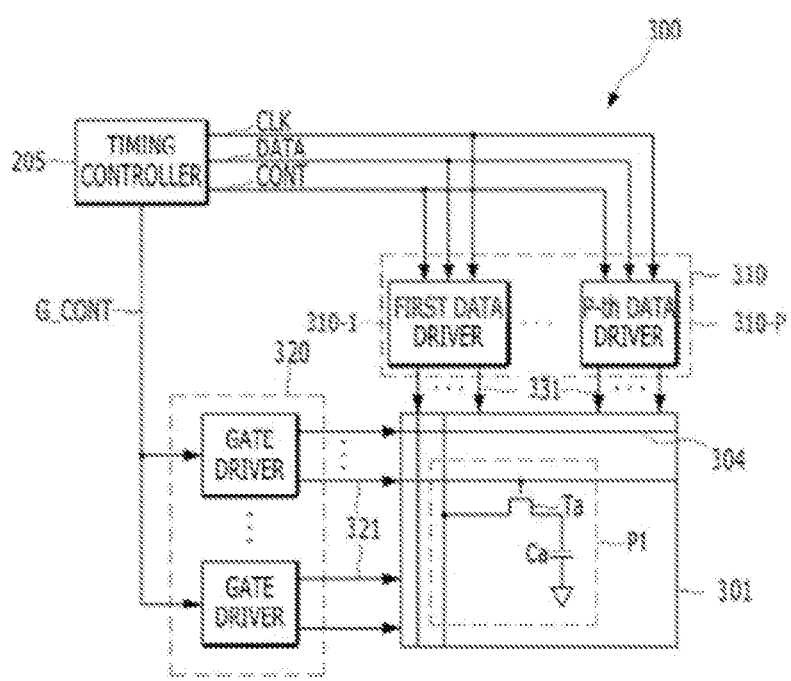
FIG. 6 illustrates an exemplary display apparatus including a data driver according to one or more embodiments.

FIG. 6 is a diagram showing a display apparatus 300 including a data driver 200 according to one or more embodiments.

Referring to FIG. 6, the display apparatus 300 includes a display panel 301, a controller 205 (or timing controller), a data driver unit 310 and a gate driver unit 320.

The display panel 301 includes gate lines 321 forming rows and data lines 331 forming columns, both of which cross each other to form a matrix, and pixels P1 connected to the gate lines and data lines near each crossing point. A plurality of pixels P1 may be provided, and each pixel P1 may include a transistor Ta and a capacitor Ca.

The controller 205 outputs a clock signal CLK, data DATA, a data control signal CONT configured to control the data driver unit 310, and a control signal G CONT configured to control the gate driver unit 320.

For example, the data control signal CONT may include a horizontal start signal, a first control signal LD, an enable signal En, and a clock signal CLK input to the shift register 210 (see FIG. 5) of the data driver.

The gate driver unit 320 may drive the gate lines 321, include a plurality of gate drivers, and output gate control signals configured to control the transistors Ta of the pixels to the gate lines.

The data driver unit 310 may drive the data lines 331 and include a plurality of data drivers 310-1 to 310-P (P being a natural number greater than 1).

Each of the data drivers 310-1 to 310-P (P being a natural number greater than 1) may be or comprise the exemplary data driver 200 shown in FIG. 5.

Embodiments of the present invention can improve the slew rate of the voltage at the output node of a data driver and reduce power consumption in a data driver.

Features, structures, effects, and the like as described above in the above embodiments are included in at least one embodiment of the present invention and should not be limited to only one embodiment. In addition, the features, structures, effects, and the like described in the various embodiments may be combined or modified with one or more other embodiments of the present invention by those skilled in the art. Accordingly, contents related to these combinations and modifications should be construed as within the scope of the present invention.

What is claimed is:

1. A half-power buffer amplifier comprising:
an amplification unit including (i) a differential amplifier configured to differentially amplify a differential input signal and (ii) first and second nodes, the amplification unit configured to output a differentially amplified output signal;
a first output unit including a first buffer unit including a first transistor and a second transistor connected between a first power source having a first voltage and a second power source having a second voltage, a second buffer unit including a third transistor and a fourth transistor connected between the first power source and the second power source, and a first switch unit connected between the first buffer unit and the second buffer unit;
a second output unit including a third buffer unit including a fifth transistor and a sixth transistor connected between the second power source and a third power source having a third voltage, a fourth buffer unit including a seventh transistor and an eighth transistor connected between the second power source and the third power source, and a second switch unit connected between the third buffer unit and the fourth buffer unit; and
an output node connected to the second connection node and a third connection node between the seventh transistor and the eighth transistor, wherein:
each of the first to third buffer units receives the differentially amplified output signal, the first switch unit includes a first switch connected between a gate of the first transistor and a gate of the third transistor, a second switch connected between a first connection node between the first transistor and the second transistor and a second connection node between the third transistor and the fourth transistor, and a third switch connected between a gate of the second transistor and a gate of the fourth transistor,
each of the first to third switches is turned on or off based on or in response to a pre-driving control signal, and
the first output unit further comprises a first connection switch between the first node and the gate of the first transistor, a second connection switch between the second node and the gate of the second transistor, a first drive switch between the first power source and the gate of the first transistor, and a second drive switch between the third power source and the gate of the second transistor.

2. The half-power buffer amplifier according to claim 1, wherein the first voltage is greater than the second voltage, and the second voltage is greater than the third voltage.

3. The half-power buffer amplifier according to claim 1, wherein the first and second connection switches are turned on or off by a first polarity control signal, and the first and second drive switches are turned on or off by a second polarity control signal.

4. The half-power buffer amplifier according to claim 3, wherein the second polarity control signal is an inverted signal of the first polarity control signal.

5. The half-power buffer amplifier according to claim 1, wherein the second output unit further comprises a third connection switch between the first node and a gate of the fifth transistor, a fourth connection switch between the second node and a gate of the sixth transistor, a third drive switch between the first power source and the gate of the fifth transistor, and a fourth drive switch between the third power source and the gate of the sixth transistor.

6. The half-power buffer amplifier according to claim 5, wherein the third and fourth connection switches are turned on or off by a first polarity control signal, and the third and fourth drive switches are turned on or off by a second polarity control signal.

7. The half-power buffer amplifier according to claim 1, wherein the second switch unit includes a fourth switch between a gate of the fifth transistor and a gate of the seventh transistor, a fifth switch between a fourth connection node between the fifth transistor and the sixth transistor and the third connection node between the seventh transistor and the eighth transistor, and a sixth switch between a gate of the sixth transistor and a gate of the eighth transistor, and each of the fourth to sixth switches is turned on or off based on or in response to the pre-driving control signal.

8. The half-power buffer amplifier according to claim 1, wherein a voltage of a pre-driving node transitions to a target voltage when the first to sixth switches are turned off,
a voltage of the output node transitions to the target voltage when the first to sixth switches are turned on, and
the pre-driving node is connected to the first transistor, the second transistor, the fifth transistor and the sixth transistor.

9. The half-power buffer amplifier according to claim 1, wherein the differential amplifier is configured to generate first to fourth currents based on or in response to the differential input signal, and the amplification unit includes:
a first current mirror configured to receive the first and second differential currents and connected to the first power source;
a second current mirror configured to receive the third and fourth differential currents and connected to the third power source; and
a bias unit connected between the first current mirror and the second current mirror.

10. The half-power buffer amplifier according to claim 9, wherein the amplification unit further comprises a first offset transistor between the first current mirror and the bias unit that operates based on or in response to a first bias signal.

11. The half-power buffer amplifier according to claim 10, wherein the amplification unit further comprises a second offset transistor between the second current mirror and the bias unit that operates based on or in response to a second bias signal.

12. A data driver comprising:
a latch unit comprising a plurality of latches, configured to store data;
a level shifter unit comprising a plurality of level shifters, configured to convert a voltage level of the data received from the latch unit;
a digital-to-analog conversion unit comprising a plurality of digital-to-analog converters, configured to convert an output from the level shifter unit into an analog signal; and
an output buffer comprising the half-power buffer amplifier according to claim 1, configured to amplify and output the analog signal.

13. A display apparatus comprising:
a display panel including gate lines, data lines and pixels connected to the gate lines and the data lines, the pixels being in a matrix including rows and columns;

the data driver according to claim 12, configured to drive the data lines; and a gate driver configured to drive the gate lines.

\* \* \* \* \*